United States Patent
Hsu et al.

(10) Patent No.: US 9,832,459 B2
(45) Date of Patent: Nov. 28, 2017

(54) OUTPUT CIRCUIT AND METHOD FOR DETECTING WHETHER LOAD CONNECTED TO CONNECTION PORT CORRESPONDING TO OUTPUT CIRCUIT

(71) Applicant: ALI Corporation, Hsinchu (TW)

(72) Inventors: Chih-Yuan Hsu, Hsinchu (TW); Yu-Shin Wang, Hsinchu (TW)

(73) Assignee: ALI Corporation, Hsinchu (TW)

( * ) Notice: Subject to any disclaimer, the term of this patent is extended or adjusted under 35 U.S.C. 154(b) by 107 days.

(21) Appl. No.: 14/930,671

(22) Filed: Nov. 3, 2015

(65) Prior Publication Data

US 2016/0301927 A1    Oct. 13, 2016

(30) Foreign Application Priority Data

Apr. 10, 2015  (CN) .......................... 2015 1 0168700

(51) Int. Cl.
*G01R 27/28* (2006.01)
*H04N 17/04* (2006.01)
*G01R 27/02* (2006.01)

(52) U.S. Cl.
CPC ........... *H04N 17/045* (2013.01); *G01R 27/02* (2013.01)

(58) Field of Classification Search
CPC .... H04L 43/0811; G01R 31/023; G01R 19/00
USPC ............ 324/66, 67, 208, 379, 439, 508, 713
See application file for complete search history.

(56) References Cited

U.S. PATENT DOCUMENTS

| | | | | | |
|---|---|---|---|---|---|
| 1,738,710 | A | * | 12/1929 | Jones ................... | G01R 31/023 174/112 |
| 5,457,704 | A | * | 10/1995 | Hoeher ................. | H03M 13/41 714/794 |
| 5,479,570 | A | * | 12/1995 | Imagawa ............. | G06K 9/6807 382/159 |
| 5,491,457 | A | * | 2/1996 | Feher .................. | H04L 27/2032 332/100 |
| 5,539,632 | A | * | 7/1996 | Marsh ........................ | H02J 3/26 323/361 |
| 5,546,079 | A | * | 8/1996 | Wagner ............... | B60L 15/2045 307/125 |
| 5,589,889 | A | * | 12/1996 | Kawaoka ............... | H04N 5/202 348/671 |
| 5,847,557 | A | * | 12/1998 | Fincher ................ | G01R 31/023 324/133 |
| 6,750,643 | B2 | * | 6/2004 | Hwang ................ | G01R 31/041 324/66 |

(Continued)

*Primary Examiner* — Giovanni Astacio-Oquendo
(74) *Attorney, Agent, or Firm* — Winston Hsu (57) ABSTRACT

An output circuit includes a level adjustment circuit and a determination circuit. The output circuit is employed for generating an output to an output terminal of the output circuit, where the output terminal is coupled to a connecting port. The level adjustment circuit is coupled to the output terminal and is employed for generating at least one adjusted signal according to a first voltage signal at the output terminal in a first period and a second voltage signal at the output terminal in a second period. The determination circuit is coupled to the level adjustment circuit and is employed for generating a determination signal according to the at least one adjusted signal, wherein the determination signal indicates whether a load is connected to the connecting port.

12 Claims, 10 Drawing Sheets

(56) References Cited

U.S. PATENT DOCUMENTS 8,284,087 B2 10/2012 Naik
8,411,073 B2 4/2013 Glen

* cited by examiner

OUTPUT CIRCUIT AND METHOD FOR DETECTING WHETHER LOAD CONNECTED TO CONNECTION PORT CORRESPONDING TO OUTPUT CIRCUIT

BACKGROUND OF THE INVENTION

1. Field of the Invention

The present invention relates generally to an output circuit, and more particularly, to an output circuit, a related detecting circuit, and a video output circuit that can detect whether a load is connected to a connecting port corresponding to the output circuit.

2. Description of the Prior Art

Typically, multimedia playback devices, such as set-up boxes, output video and audio signals to display devices through connecting ports and transmission cables. Since there are a variety of different video signaling standards used by the display devices, a multimedia playback device usually has several connecting ports complying with different video signaling standards, such as, composite video, S-Video, component video, digital visual interface (DVI) and high definition multimedia interface (HDMI) standards. However, in actual use, not every connecting port is not connected to a display device, but output circuits or signal processing circuits corresponding to the "un-connected" connecting port still keeps operating since it is not informed of connection status (i.e., whether the display device is connected to the connecting port). As such, the output circuit or signal processing circuit operates to consume power even if it does not need to outputs signals for the display device. This leads to unnecessary power consumption. To reduce the unnecessary power consumption, there exist several detection techniques for detecting the connection status of the load. These detection techniques further allow the multimedia playback device either to turn off the output circuit/the signal processing circuit or to make the output circuit/the signal processing circuit enter a low power mode while the corresponding connecting port is detected to be un-connected.

A common detection method is to dispose a mechanically-driven switch inside the connecting port. The mechanically-driven switch can generate a current signal or a voltage signal when a connector of a transmission cable is plugged into the connecting port. This is achieved by a contact spring of the mechanically-driven switch trigging a signal generation circuit to be shorted or opened, thereby generated a detection signal. The detection signal is sent back to the output circuit/the signal processing circuit and accordingly controls the operating of the output circuit/the signal processing circuit. The output circuit/the signal processing circuit can be turned off as long as it does not receive the detection signal generated by the mechanically-driven switch. On the other hand, when the transmission cable is plugged into the connecting port, the output circuit/the signal processing circuit will be turned on. However, such mechanically-driven switch and related signal generation circuit increases the implementation cost. Also, this detection method requires the output circuit/the signal processing circuit to provide additional signal pin to receive the detection signal generated by the mechanically-driven switch. Therefore, the layout of the output circuit and the signal process circuit become more complicated, and what is even worse, the mechanically-driven switch may wear down or break down because of repeatedly uses.

Figure 1:
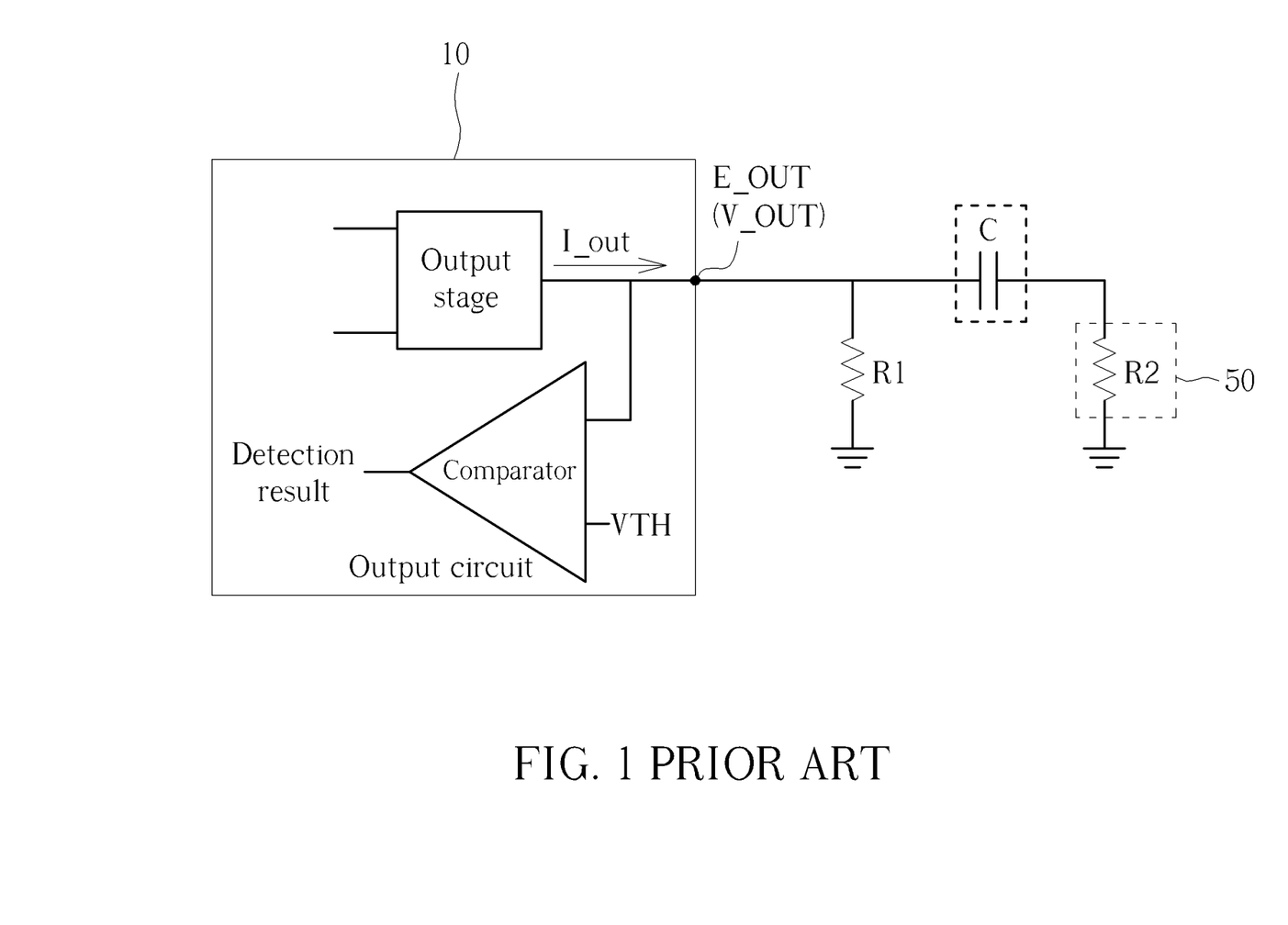
FIG. 1 is a schematic diagram of a conventional output circuit.
Figure 2:
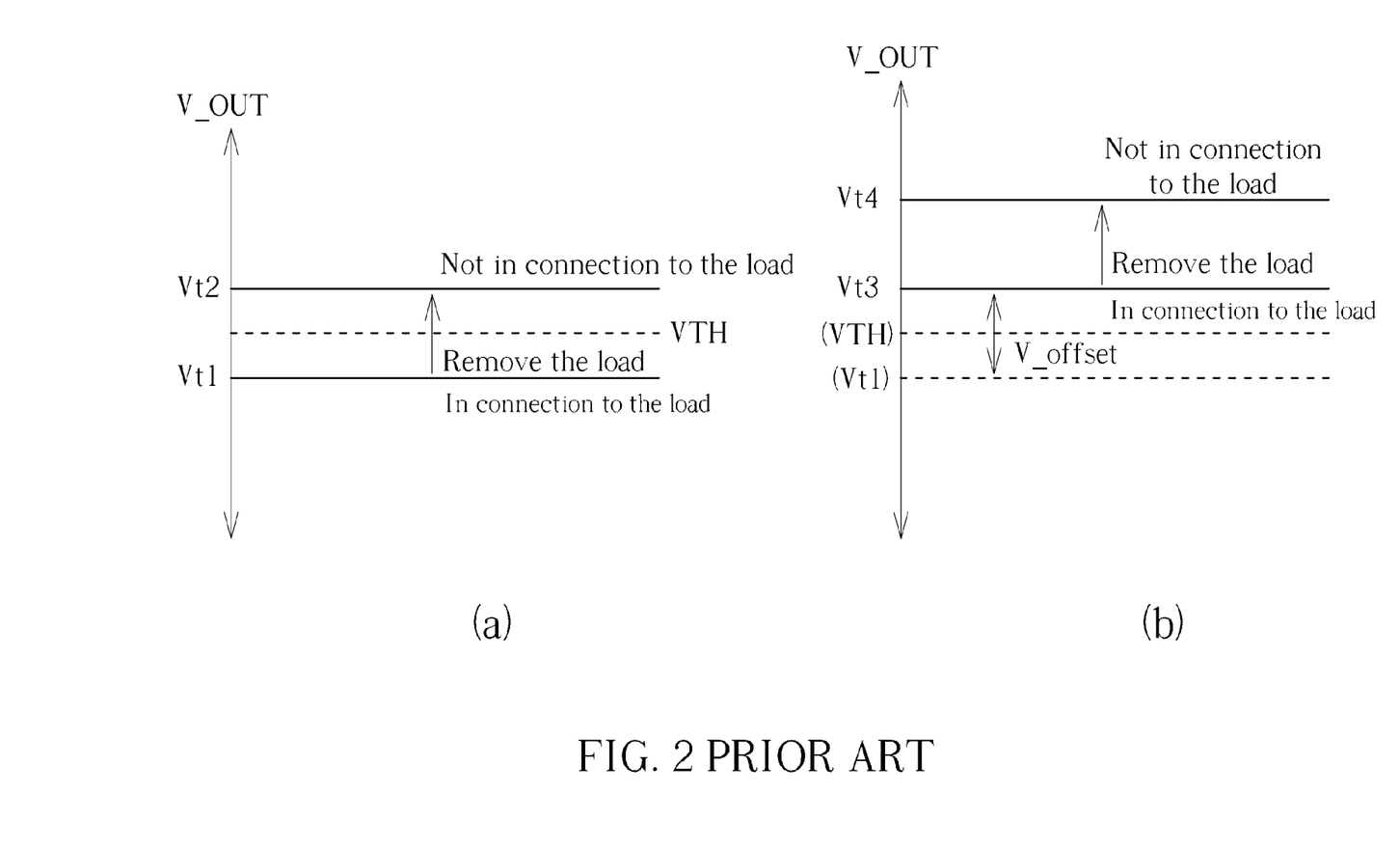
FIG. 2 illustrates why the conventional output circuit fails to identify a connection status of the load.

FIG. 1 and FIG. 2 further illustrate a conventional detection method, and problems thereof. Please refer to FIG. 1. An output stage of an output circuit 10 could generate an output current I_OUT to an output terminal E_OUT, which is provided to a load 50. A matching resistor R1 is in connection to the output terminal E_OUT. A resistance of the matching resistor R1 is matched to a resistance of an equivalent resistor R2 of the load 50. In such detection method, a comparator compares a voltage V_OUT at the output terminal E_OUT with a threshold voltage value VTH. Accuracy of this detection method is affected by how the load 50 is coupled to the output circuit 10. Part (a) of FIG. 2 illustrates changes in the voltage V_OUT in a case of DC coupling (i.e., the coupling capacitor does not exist), where the output stage of the output circuit 10 is assumed to output a fixed current I_OUT. When the load 50 is connected to the output circuit 10, the matching resistor R1 that is in-series connection to the output terminal E_OUT will turn out to be in parallel connection to an equivalent resistor R2 of the load. This causes a lower voltage V_OUT (having a voltage value Vt1) generated at the output terminal E_OUT. On the other hand, if the load 50 is not connected to the output circuit 10, a higher voltage V_OUT (having a voltage value Vt2) thus generated at the output terminal E_OUT. A comparator of the output circuit 10 could set the threshold voltage VTH to have a value between the voltage values Vt1 and Vt2. Part (b) of FIG. 2 illustrates changes in the voltage V_OUT in a case of AC coupling (i.e., the coupling capacitor exists). In such case, the change in the voltage V_OUT is similar to that is in the case of DC coupling. That is, when the load 50 is not connected to the output circuit 10, the voltage V_OUT rises up. Regardless of the connection of the load 50 with the output circuit 10, the value of the voltage V_OUT is always higher than the value is in DC coupling. When the load 50 is connected to the output circuit 10, the voltage value Vt3 of the voltage V_OUT is higher than the voltage value Vt1 in DC coupling. When the load 50 is not connected to the output circuit 10, the voltage value Vt4 of the voltage V_OUT is higher than the voltage value Vt2 in DC coupling. In other words, the coupling capacitor C introduces a positive offset V_offset to the voltage V_OUT. Hence, in the case of AC coupling, both of voltage values Vt3 and Vt4 are higher than the threshold voltage value VTH. It is improper for the comparator of the output circuit 10 to identify the connection status of the connecting port according to the threshold voltage value VTH that is determined based on the voltage values Vt1 and Vt2. Unless the threshold voltage is designed to vary with the existence of the coupling capacitor C, this is impossible to determine a threshold voltage that is able to satisfy conditions of both AC coupling and DC coupling. However, it is complicated to design a variable threshold voltage and may increase the complexity of the output circuit 10. In view of this, there is a need to improve the conventional detection method.

SUMMARY OF THE INVENTION

In view of above, the coupling capacitor between the output circuit and the load introduces an offset to the output voltage at the output terminal of the output circuit and the comparator accordingly fails to determine whether the load is connected to the output circuit. Thus, it is one objective of the present invention to provide a method to eliminate the offset in the output voltage. The method of the present invention can set a determination criterion (i.e., the threshold voltage for the comparator) that is able to identify the connection status of the connecting port regardless of the offset. Specifically, the present invention introduces a level adjustment circuit into the output circuit for eliminating the offset in the output voltage. The present invention causes different voltages generated at the output terminal of the output circuit within different period of times, respectively. Then, the present invention uses the level adjustment circuit to sample the voltages in different period of times and accordingly generates an adjusted signal. At last, the determination circuit determines whether the load is connected to the output circuit according to the adjusted signal. As the offset in the voltage at the output terminal is consistent, the level adjustment circuit calculates a difference between the voltage signals sampled in different period of times, such that the offset can be cancelled. As a result, the following determination circuit will not be affected by the offset and will not fail to identify the connection status of the connecting port.

According to a first aspect to the present invention, an output circuit for generating an output to an output terminal that is coupled to a connecting port comprises: a level adjustment circuit and a determination circuit. The level adjustment circuit is coupled to the output terminal, and arranged for generating at least one adjusted signal according to a first voltage signal at the output terminal in a first period and a second voltage signal at the output terminal in a second period. The determination circuit is coupled to the level adjustment circuit, and arranged for generating a determination signal according to the at least one adjusted signal, wherein the determination signal indicates whether a load is connected to the connecting port.

According to a second aspect to the present invention, a method of detecting whether a load is connected to a connecting port that corresponds to an output circuit and coupled to an output terminal of the output circuit, comprises: generating a first voltage signal at the output terminal in a first period and a second voltage signal at the output terminal in a second period; generating at least one adjusted signal according to the first voltage signal and the second voltage signal; and generating a determination signal according to the at least one adjusted signal, wherein the determination signal indicates whether a load is connected to the connecting port.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
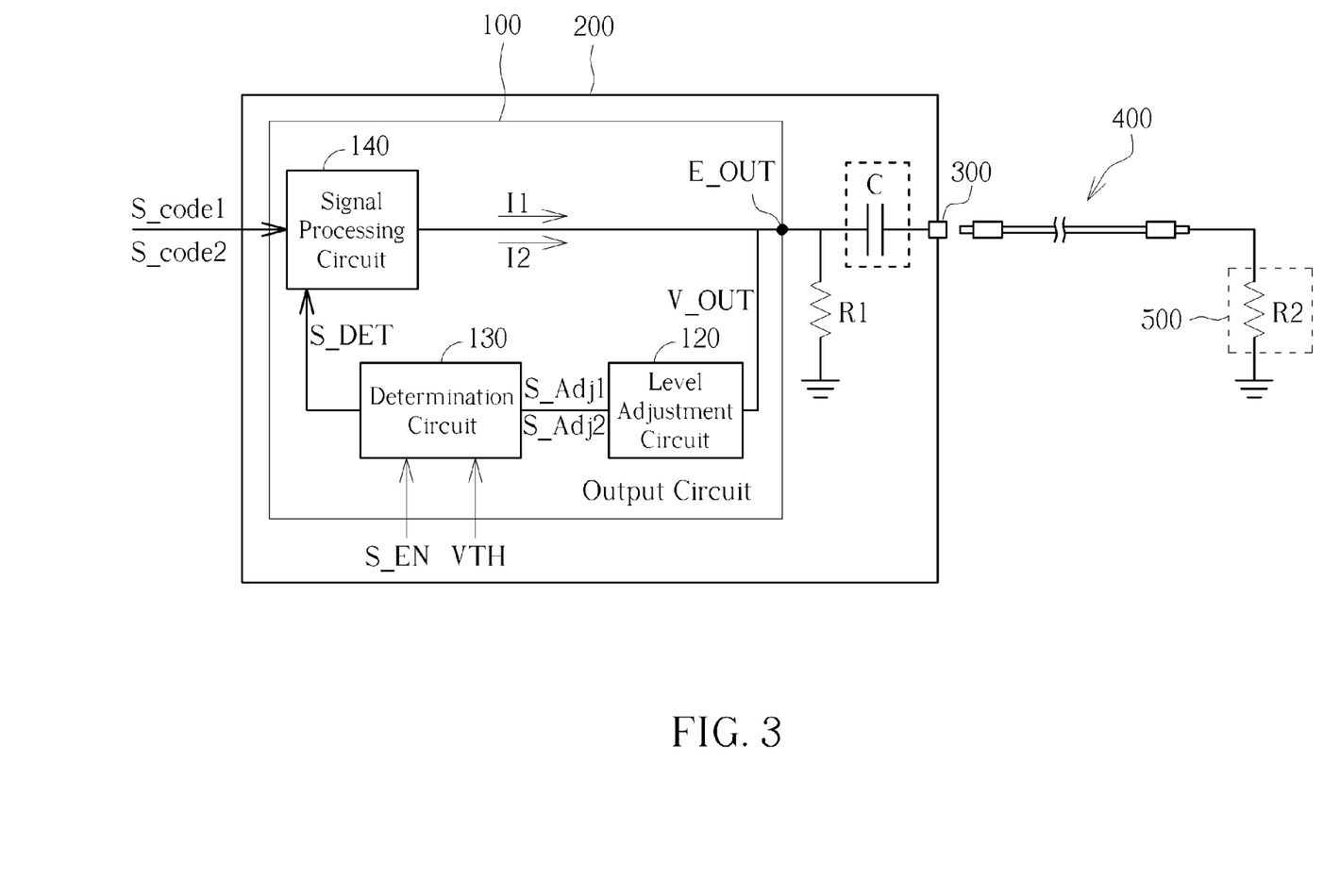
FIG. 3 is a schematic diagram of an output circuit according to one embodiment of the present invention.

FIG. 3 illustrates a schematic diagram of an output circuit according to one embodiment of the present invention. As illustrated, an output circuit 100 comprises a level adjustment circuit 120 and a determination circuit 130. The output circuit 100 has an output terminal E_OUT, which is connected to a connecting port 300 via wires/traces on a circuit board 200. There is a matching resistor R1 disposed on the circuit board 200, which is connected between the connecting port 300 and the output terminal E_OUT. The matching resistor R1 is used to match the impedance of an equivalent resistor R2 of an external device 500 (e.g. a display device), where resistances of resistor R1 and R2 are respectively represented as R1 and R2. A coupling resistor C may exist between the connecting port 300 and the output terminal E_OUT. The external device 500 is connected to one end of a transmission cable 400, and the other end of the transmission cable 400 may be plugged into the connecting port 300. The output circuit 100 further includes a signal processing circuit 140. When the transmission cable 400 is plugged into the connecting port 300, a current output stage of the signal processing circuit 140 will output signals (e.g. video signals) to the external device 500. In the following descriptions, the phrase "the load is connected to the output circuit" refers to the output circuit 100, the transmission cable 400 and the external device 500 are connected to each other. On the other hand, "the load is not connected to the output circuit" refers to the output circuit 100, the transmission cable 400 and the external device 500 are not connected to each other. For example, the transmission cable 400 is not plugged into the connecting port or the transmission cable 400 is plugged into the connecting port but not connected to the external device 500.

In one embodiment, the signal processing circuit 140 comprises a current output digital-to-analog converter (DAC). The DAC generates output signals to control the current output stage according to the first digital signal S_code1 and the second digital signal S_code2. Within the first operating phase Phase_1 and the second operating phase Phase_2 respectively, the DAC generates a first current I1 and the second current I2 corresponding respectively to the first digital signal S_code1 and the S_code2. Accordingly, a voltage signal V1 and a voltage signal V2 will be respectively generated at the output terminal E_OUT. The level adjustment circuit 120 samples the voltage signals V1 and V2, and accordingly generates at least one adjusted signal S_Adj1. In the adjusted signal S_Adj1, the possible offset caused by the coupling capacitor C is eliminated. The following descriptions will explain how the level adjustment circuit 120 works.

Suppose that the load is not connected to the output circuit 100 and the coupling capacitor C does not exist, the first current I1 generated by the current output stage of the signal processing circuit 140 in the first operating phase Phase_1 will generate a first voltage signal V1 having the value of I1*R1 at the output terminal E_OUT. However, if the coupling capacitor C is placed between the load and the output circuit 100 (if the current output stage of the signal processing circuit 140 still generates the first current I1), the coupling capacitor C will lead to a potential difference Δ1. This makes the value of the first voltage signal V1 become I1*R1+Δ1.

Similarly, if the load is not connected to the output circuit 100 and the coupling capacitor C does not exist, the second current I2 generated by the current output stage of the signal processing circuit 140 in the second operating phase Phase_2 will generate a second voltage signal V2 having the value of I2*R1 at the output terminal E_OUT. However, if the coupling capacitor C is placed between the load and the output circuit 100 (if the current output stage of the signal processing circuit 140 still generates the second current I2), the coupling capacitor C will lead to a potential difference Δ2. This makes the value of the second voltage signal V2 become I2*R2+Δ2. That is, no matter whether the coupling capacitor exists or not, subtracting the voltage signal V1 at the output terminal E_OUT from the voltage signal V2 at the output terminal E_OUT can obtain the voltage difference V2−V1=(I2−I1)*R1. Obviously, subtracting one voltage from another voltage at the output terminal E_OUT that are sampled in different period of times can eliminate the offset Δ1 caused by the coupling capacitor C.

When the load is connected to the output circuit 100 and the coupling capacitor C does not exist, the first current I1 generated by the current output stage of the signal processing circuit 140 in the first operating phase Phase_1 will generate a first voltage signal V1 having the value of I1*(R1//R2) at the output terminal E_OUT. When the coupling capacitor C exists, the first voltage signal V1 at the output terminal E_OUT has the value of I1*(R1//R2)+Δ2.

Similarly, when the load is connected to the output circuit 100 and the coupling capacitor C does not exist, the second current I2 generated by the current output stage of the signal processing circuit 140 in the second operating phase Phase_2 will generate a second voltage signal V2 having the value of I2*(R1//R2) at the output terminal E_OUT. When the coupling capacitor C exists, the second voltage signal V2 at the output terminal E_OUT has the value of I2*(R1//R2)+Δ2. Subtracting one voltage from another voltage at the output terminal E_OUT that are sampled in different period of times can obtain V2−V1=(I2−I1)*(R1//R2). Hence, when the load is connected to the output circuit 100, sampling the voltages at the output terminal E_OUT in different phases and then subtracts the sampled results from one another can eliminate the offset Δ2 caused by the coupling capacitor C.

As mentioned above, when the load is connected to the output circuit 100, a voltage signal difference V2−V1=(I2−I1)*(R1//R2) can be obtained by subtracting the first voltage signal V1 from the second voltage signal V2 that are sampled indifferent period of times. When the load is not connected to the output circuit 100, a voltage signal difference V2−V1=(I2−I1)*(R1) can be obtained. Hence, unlike the first voltage signal V1 and the second voltage signal V2, the voltage signal difference V2−V1 will not be affected by the offset. On the other hand, as the voltage signal difference (I2−I1)*(R1//R2) in the case where the load is connected is lower than the voltage signal difference V2−V1=(I2−I1)*R1 in the case where the load is not connected (; by the way, if the impedances are fully matched, the voltage signal difference when the load is connected is only half the voltage signal difference when the load is not connected), the voltage signal difference V2−V1 can fully reflect the change in the output voltage in response to the connection status of the load.

In sum, sampling voltages at the output terminal E_OUT in different operating phases and then calculating the difference therebetween can obtain a signal that fully reflects the connecting status but is not affected by the offset. The present invention uses level adjustment circuit 120 to eliminate the offset. The level adjustment circuit 120 samples and holds a first voltage signal V1 at the output terminal in the first operating phase Phase_1. In the second operating phase Phase_2, the level adjustment circuit 120 generates an adjusted signal S_Adj1 according to the held first voltage signal V1 and a second voltage signal V2 currently at the output terminal E_OUT.

Figure 4:
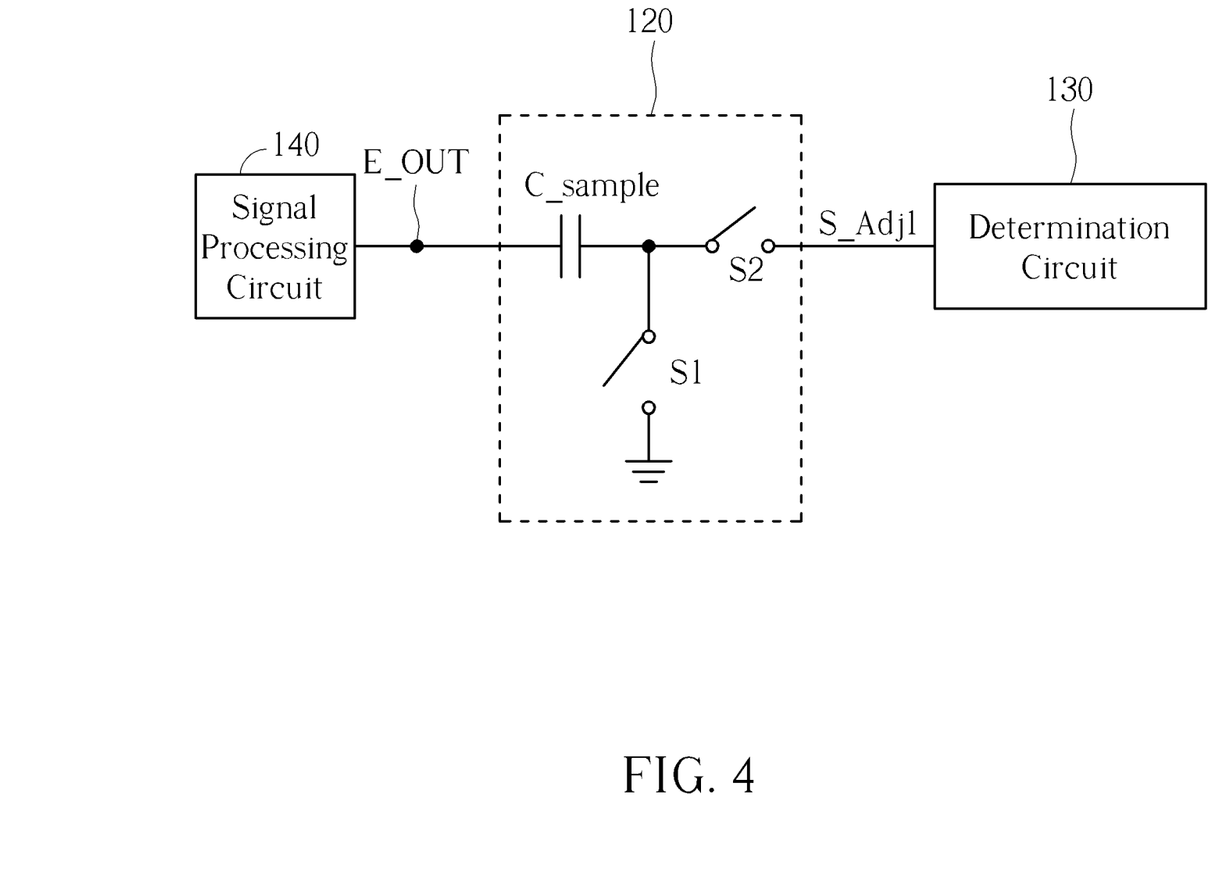
FIG. 4 is a schematic diagram of the level adjustment circuit of the output circuit according to one embodiment of the present invention.

FIG. 4 illustrates a schematic diagram of the level adjustment circuit 120 according to one embodiment of the present invention, wherein the level adjustment circuit 120 comprises a sample and hold circuit that includes a sampling capacitor C_sample and controllable switches S1 and S2. The controllable switches S1 and S2 can be controlled by control signals that are generated by external circuits or controlled by internal controllers according to various embodiments of the present invention.

Figure 5:
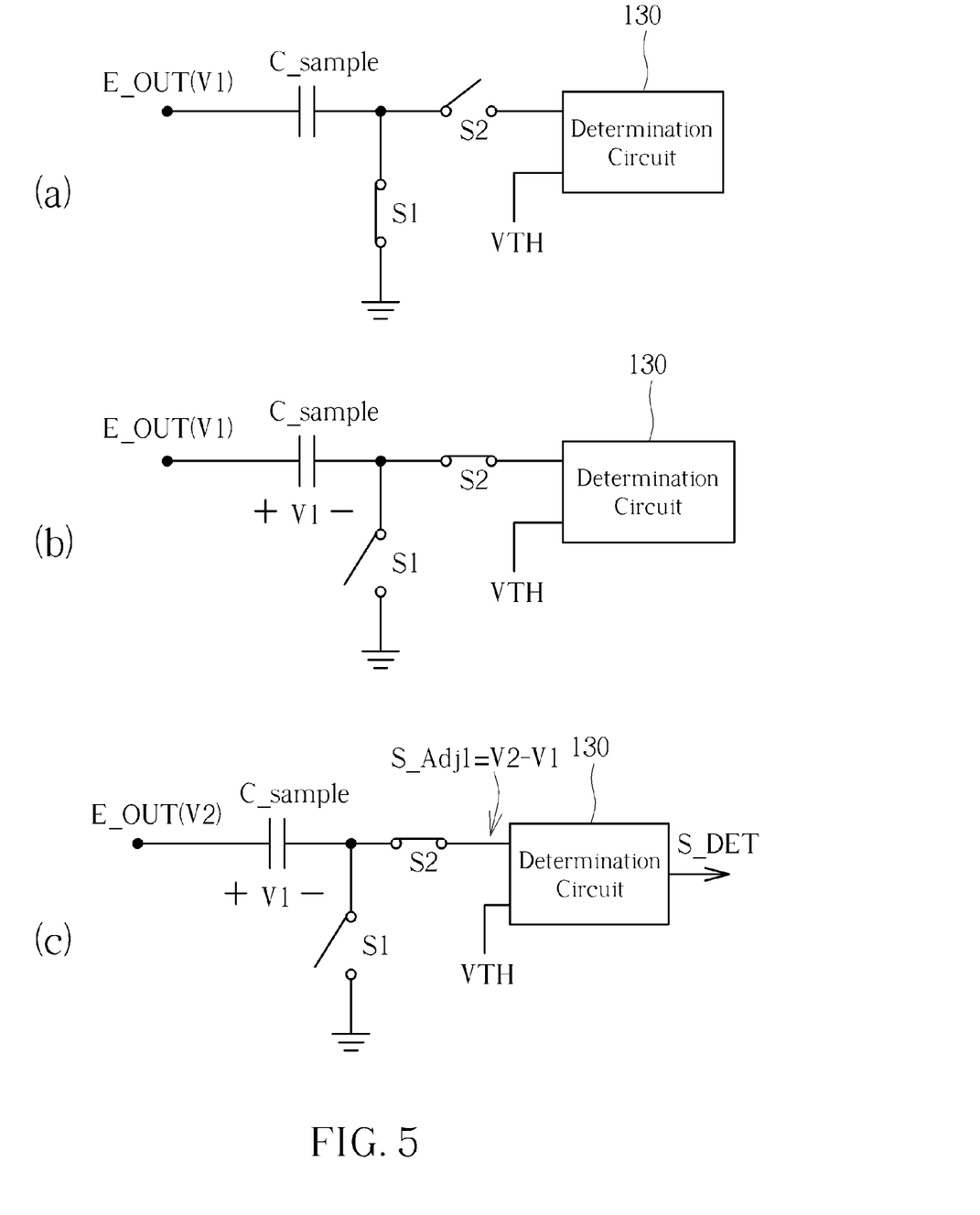
FIG. 5 is a diagram illustrating operations of the level adjustment circuit of FIG. 4 with respect to different operating phases.

Parts (a) and (b) of FIG. 5 respectively illustrate operations of the level adjustment circuit 120 in the first half and the second half of the first operating phase Phase_1. In the first half of the first operating phase Phase_1, the controllable switch S1 is conductive. This allows the sampling capacitor C_sample to be connected between the output terminal E_OUT and the ground. Subsequently, the first voltage signal V1 at the output terminal E_OUT in the first operating phase Phase_1 is sampled by the sampling capacitor C_sample. Then, in the second half of the first operating phase Phase_1 represented by the part (b), the controllable switch S2 is conductive and the controllable switch S1 is un-conductive. This allows the sampling capacitor C_sample to be connected between the output terminal E_OUT and an input terminal of the determination circuit 130, having the first voltage signal V1 held in the sampling capacitor C_sample. Also, the potential difference between two ends of the sampling capacitor C_sample will be identical to the first voltage signal V1. Part (c) of FIG. 5 illustrates operations of the level adjustment circuit 120 in the second operating phase Phase_2. In the meantime, the controllable switch S2 remains conductive while the controllable switch S1 remains un-conductive. Therefore, the sampling capacitor C_sample remains connected to the output terminal E_OUT and the determination circuit 130. Since the voltage at the output terminal E_OUT in the second operating phase Phase_2 is V2, and the potential difference between two ends of the sampling capacitor is V1, the level adjustment circuit 120 will provide an adjusted signal S_Adj1 that is identical to V2−V1 to the determination circuit 130 in the second operating phase Phase_2.

In the second operating phase Phase_2, the determination circuit 130 is enabled, and compares the adjusted signal S_Adj1 that is identical to the voltage signal difference V2−V1 with the reference signal VTH, thereby generating a determination signal S_DET which can indicate whether the load is connected to the output circuit 100. When it is indicated that the load is not connected to the output circuit 100, the determination signal S_DET can be further used to turn off the signal processing circuit 140.

According to various embodiments of the present invention, the determination circuit 130 can be implemented with a comparator or other circuits that can compare signals at their input terminals to determine which one of the voltage signal difference V2−V1 and the reference signal VTH is higher. As explained above, no matter whether the coupling capacitor C exists or not, the voltage signal difference V2−V1 will be the same. Hence, the voltage signal difference V2−V1 is substantially immune against the offset caused by the coupling capacitor C. The selection of the reference signal VTH of the determination circuit 130 only needs to consider changes of the voltage signal difference V2−V1 in different connecting statues of the load. That is, the voltage signal difference is (I2−I1)*(R1//R2) when the load is connected, while the voltage signal difference is (I2−I1)*R1 when the load is not connected. The reference signal VTH could be set between these two levels. As a result, the determination circuit 130 can correctly determine whether the load is connected to the output circuit 100. It should be noted that architecture of the level adjustment circuit 120 illustrated in FIG. 4 is not a limitation of the present invention. According to various embodiments of the present invention, the level adjustment circuit 120 may include different quantities of sample capacitors or controllable switches, and different ways of element connections.

Figure 6:
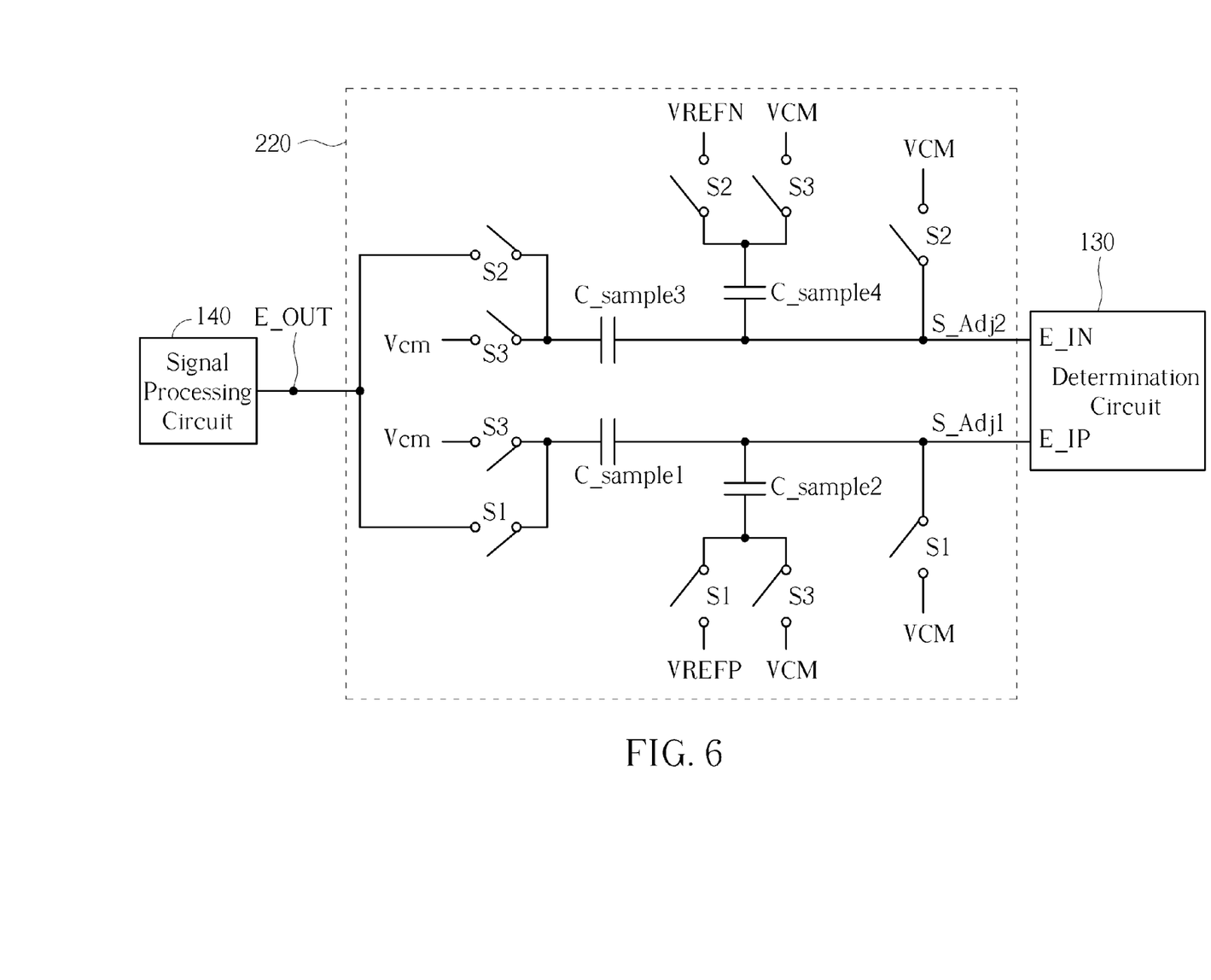
FIG. 6 is a schematic diagram of the level adjustment circuit of the output circuit according to another embodiment of the present invention.
Figure 7:
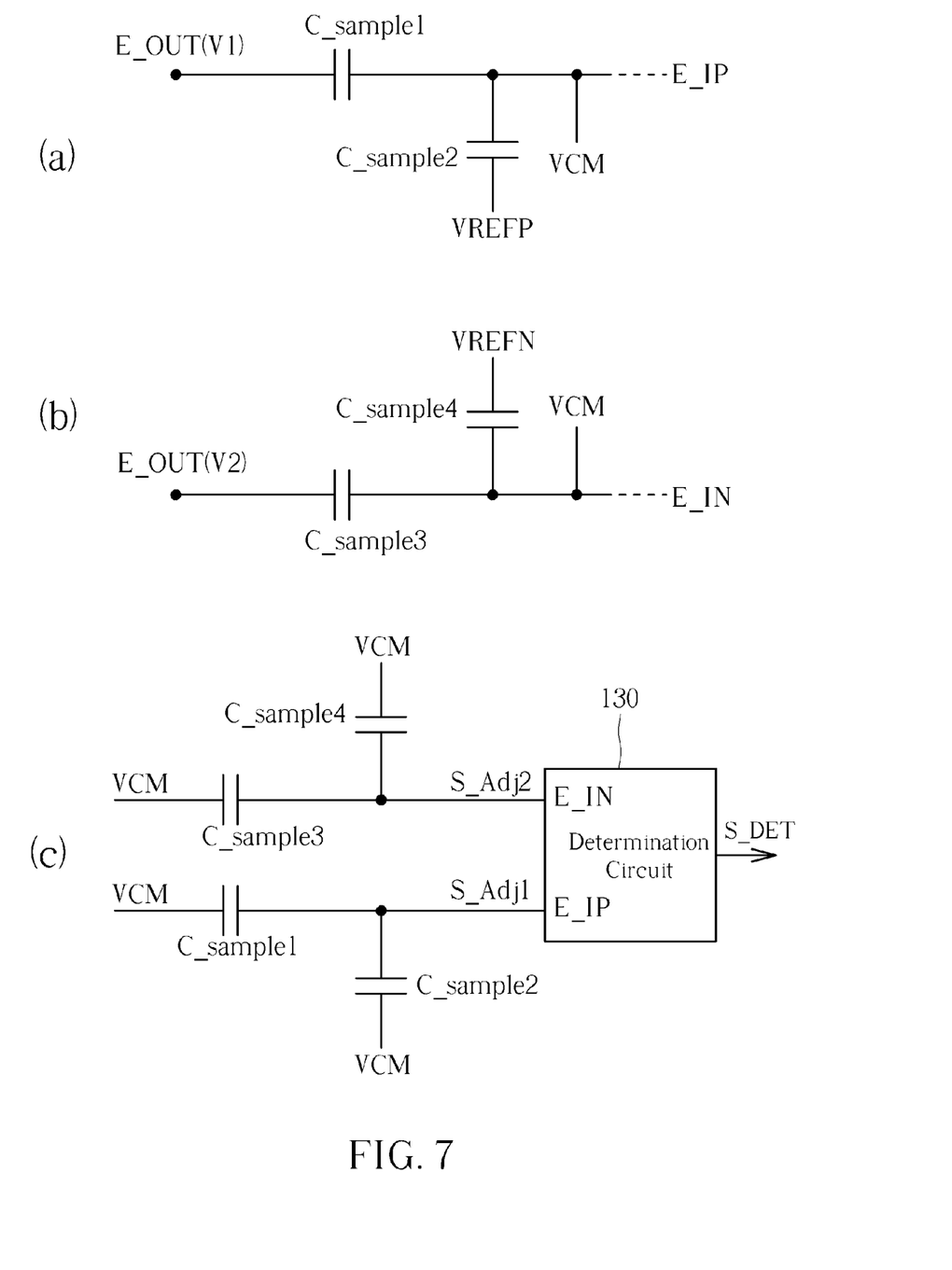
FIG. 7 is a diagram illustrating operations of the level adjustment circuit of FIG. 6 with respect to different operating phases.

FIG. 6 illustrates a level adjustment circuit 220 according to another embodiment of the present invention. As illustrated, the level adjustment circuit 220 includes a sample and hold circuit comprised of a plurality of sampling capacitors C_sample1, C_sample2, C_sample3 and C_sample4, and a plurality of controllable switches S1, S2 and S3. The sample and hold circuit is connected between the output terminal E_OUT of the signal processing circuit 140, and the two input terminals E_IP and E_IN of the determination circuit 130. Operations of the sample and hold circuit of this embodiment can be understood by FIG. 7. Part (a) of FIG. 7 illustrates the operations of the controllable switches in a first operating phase Phase_1. In the meantime, the controllable switch S1 of FIG. 6 will be conductive, the sampling capacitors C_sample1 and C_sample2 sample the first voltage signal V1 at the output terminal E_OUT and the first reference signal VREFP in the first operating phase Phase_1. In first operating phase Phase_1, an amount of charges stored in the sampling capacitor C_sample1 is (V1−VCM)*c1 (c1 is the capacitance of the sampling capacitor C_sample1), and an amount of charges stored in the sampling capacitor C_sample2 is (VREFP−VCM)*c2 (c2 is the capacitance of the sampling capacitor C_sample2). Then, in the second operating phase, Phase_2, the controllable switch is conductive. In the meantime, the sampling capacitors C_sample3 and C_sample4 samples the second voltage signal V2 at the output terminal E_OUT and the second reference signal VREFN in the second operating phase Phase_2 (as illustrated by part (b) of FIG. 7). In the second operating phase Phase_2, an amount of charges stored in the sampling capacitor C_sample3 is (V2−VCM)*c3 (c3 is the capacitance of the sampling capacitor C_sample3), and an amount of charges stored in the sampling capacitor C_sample4 is (VREFN−VCM)*c4 (c4 is the capacitance of the sampling capacitor C_sample4). Part (c) of FIG. 7 corresponds to operations of the controllable switches in a third operating phase Phase_3. In the meantime, the controllable switch S3 is conductive, which allows one end of each of the sampling capacitors C_sample1-C_sample4 to connect the common mode voltage VCM, and allows another end of each of the sampling capacitors C_sample1-C_sample4 to respectively connect input terminals E_IP or E_IN of the determination circuit 130. Specifically, one end of each of the sampling capacitors C_sample1-C_sample2 is connected to the common mode voltage VCM, and the other end is connected to the input terminal E_IP of the determination circuit 130. In addition, one end of each of the sampling capacitors C_sample3-C_sample4 is connected to the common mode voltage VCM, and the other end is connected to the input terminal E_IN of the determination circuit 130. Such connections cause the charges stored in the sampling capacitors C_sample1-C_sample4 to be redistributed. Due to charge conservation, the following equations can be obtained:

$$(VCM-VIN)*c1+(VCM-S\_Adj1)*c2=(V1-VCM)*c1+(VREFP-VCM)*c2 \quad EQ(1)$$

$$(VCM-VIP)*c3+(VCM-S\_Adj2)*c4=(V2-VCM)*c3+(VREFN-VCM)*c4; \quad EQ(2)$$

wherein the adjusted signals S_Adj1 and S_Adj2 are signals that are generated by the level adjustment circuit 220 and outputted to the input terminals E_I and E_IN of the determination circuit 130.

Suppose that the capacitances of the sampling capacitors C_sample1 and C_sample2 are identical, the above first equation EQ(1) can be simplified as:

$$S\_Adj1=(4*VCM-V1-VREFP))/2 \quad EQ(3)$$

In addition, suppose that the capacitances of the sampling capacitors C_sample3 and C_sample4 are identical, the above second equation EQ(2) can be simplified as:

$$S\_Adj2=(4*VCM-V2-VREFN))/2 \quad EQ(4)$$

Then, subtracting the equation EQ(3) from the equation EQ(4) can lead to:

$$S\_Adj1-S\_Adj2=((VREFP-VREFN)-(V2-V1))/2.$$

Further, suppose that VREFP−VREFN=VTH, it can be obtained:

$$S\_Adj1-S\_Adj2=((VTH)-(V2-V1))/2.$$

Therefore, as long as the determination circuit 130 compares the adjusted signals S_Adj1 and S_Adj2 at input terminals E_IP and E_IN, the determination circuit 130 could determine whether V2−V1 is higher than the reference signal VTH. The level adjustment circuit 220 also calculates a difference between the first voltage signal V1 and the second voltage signal V2 at the output terminal in different periods of times to eliminate the offset. In addition, the level adjustment circuit 220 further samples the reference signal VREFP and VREFN, and accordingly reflects them on the adjusted signals S_Adj1 and S_Adj2. As a result, the output S_DET of the determination circuit 130 can indicate whether the load is connected to the output circuit 100 based on the adjusted signals S_Adj1 and S_Adj2.

Figure 8:
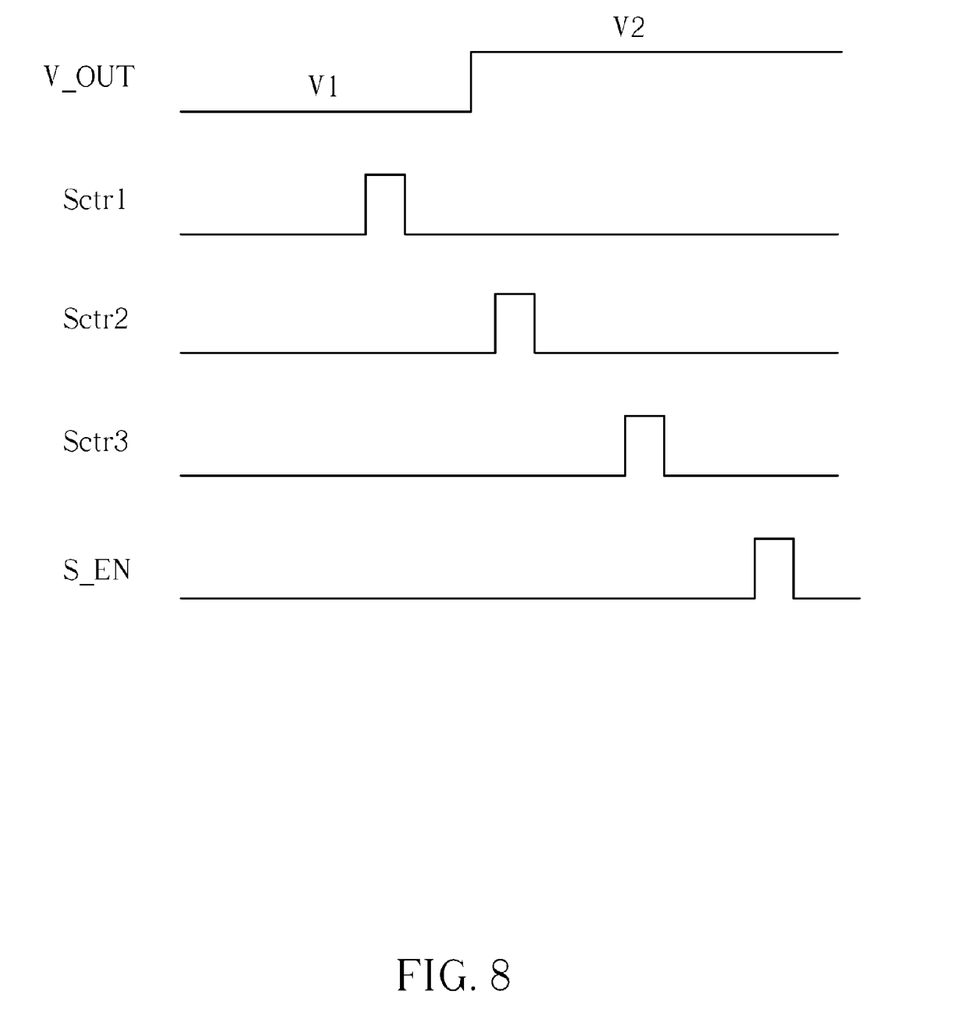
FIG. 8 is a timing diagram of control signals in the level adjustment circuit of FIG. 6.

FIG. 8 illustrates timing chart of voltage signal V_OUT at the output terminal E_OUT, control signals Sctrl1-Sctrl3 for controllable switches S1-S3 of the level adjustment circuit 220 and the enablement signal S_EN of the determination circuit 130 with respect to different operating phases. When the value of the voltage signal V_OUT at the output terminal E_OUT is identical to V1, the control signal Sctrl1 is asserted, which allows the controllable switch S1 to be conductive. Then, the level adjustment circuit 220 samples the voltage signal V1 and reference signal VREFP. When the value of the voltage signal V_OUT at the output terminal E_OUT is identical to V2, the control signal Sctrl2 is asserted, which allows the controllable switch S2 to be conductive. The level adjustment circuit 220 accordingly samples the voltage signal V2 and reference signal VREFN. At last, the control signal Sctrl3 is asserted, which allows the controllable switch S3 to be conductive. Subsequently, charges stored in the sampling capacitor C_sample1-C_sample4 are re-distributed. Afterwards, the enablement signal S_EN is asserted, which enables the determination circuit 130 to compare the adjusted signals S_Adj1 and S_Adj2, and generates the determination result S_DET.

Figure 9:
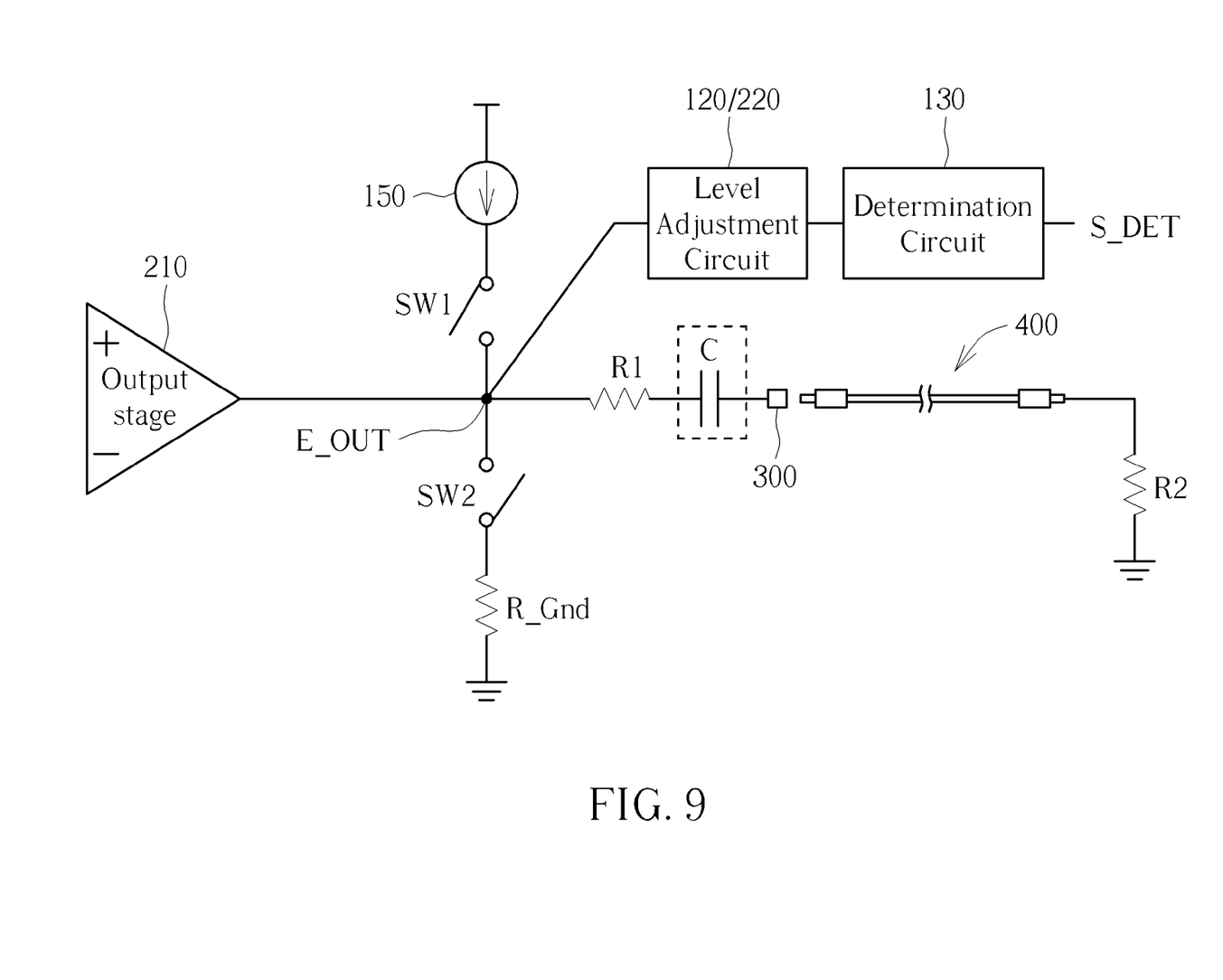
FIG. 9 is a schematic diagram of an output circuit according to another embodiment of the present invention.

In the above embodiments, the signal processing circuit 140 may include a current output DAC, which provides the current I1 and I2 as outputs in different operating phases, thereby generating the voltage signals V1 and V2 at the output terminal E_OUT. Alternatively, the signal processing circuit 140 may include a voltage output DAC. FIG. 9 illustrates an implementation of the output circuit 100 when the signal processing circuit 140 includes the voltage output DAC. In this embodiment, the signal processing circuit 140 includes a voltage output stage 210 that is used for generating output signals, and coupled to the output terminal E_OUT. A current source 150 respectively provides a first reference current and a second reference current in the first operating phase Phase_1 and the second operating phase Phase_2, thereby generating the voltage signals V1 and V2 at the output terminal E_OUT. In the first operating phase Phase_1 and the second operating phase Phase_2, the switches SW1 and SW2 are conductive, and the current source 150 provides proper current to flow through the resistor R_Gnd, thereby generating the voltage signals V1 and V2 at the output terminal E_OUT. Operations of the level adjustment circuit 120/220 and the determination circuit 130 are the same as mentioned above.

Figure 10:
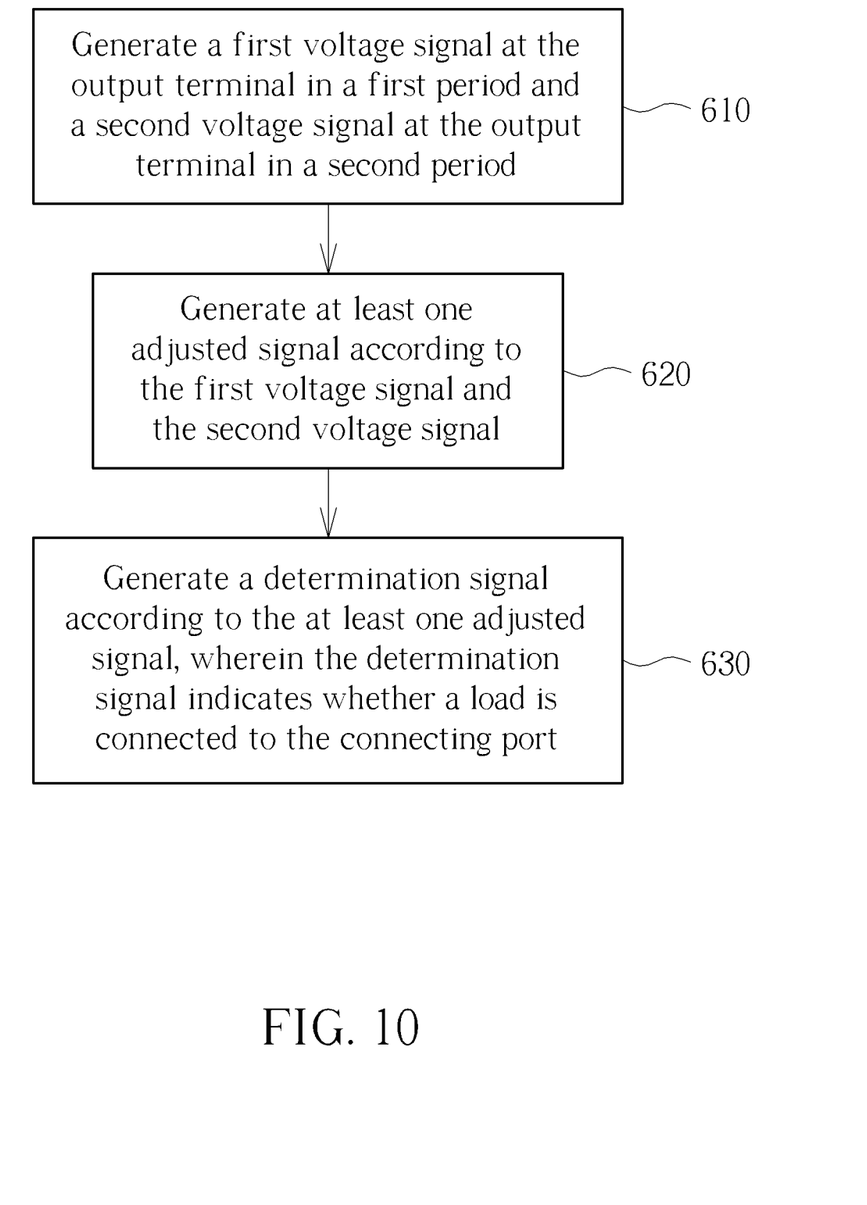
FIG. 10 is a flowchart regarding operations of an output circuit according to one embodiment of the present invention.

FIG. 10 illustrates a flowchart regarding operations of the output circuit 100 according to one embodiment of the present invention, which includes steps:

Step 610: generating a first voltage signal at an output terminal in a first period, and generating a second voltage signal at the output terminal in a second period.

Step 620: generating at least one adjusted signal according to the first voltage signal and the second voltage signal.

Step 630: generating a determination signal indicating whether a load is connected to a connecting port according to the determination signal.

Principles and details of the above steps are explained in the above paragraphs, repeated descriptions are omitted here for the sake of brevity.

The above-mentioned output circuit and detection method can be applied to any signal processing systems, including video processing systems. Typically, a video processing system needs the front-stage circuits to perform demodulation, decoding and video adjustment operations on received video data. In a consequence, video signals generated by the front-stage circuits will be sent to back-stage circuits of the video processing system for further processing, and then outputted to a display device (e.g. the external device 500). The output circuit 100 of the present invention can be used as apart of the back-stage circuits, receiving the video signals from the front-stage circuits, and then signal-converting and amplifying the received video signals. Hence, even if the front-stage circuits output the video signal to the back-stage circuits, the back-stage circuits can still turn off/de-activate its internal functional blocks/modules or place them in a power saving mode as long as it detects the display device is not connected to the connecting port. As such, the unnecessary power consumption can be saved. The signal processing circuit 140 of the output circuit 100 may include a DAC, which converts digital video signals generated by the front-stage circuits into analog video signals. Accordingly, the voltage output stage or the current output stage of the signal processing circuit 140 can amplify the analog video signals. The amplified analog video signals will be transmitted to the display device through the transmission cable 400 which is connected to the connecting port 300.

The detection method can be used in a blanking period in which the signal processing circuit 140 does not actually output video contents, to perform the above-mentioned first operating phase Phase_1, second operating phase Phase_2 and third operating phase Phase_3, thereby detecting whether a display device is connected to the output circuit 100. The signal processing circuit 140 may receive specific digital codes and accordingly generates specific analog signal. Then, the signal processing circuit 140 allows the current/voltage output stage to generate the first current I1 and second current I2 or allows the current source 150 to generate proper current, such that the first voltage signal V1 and the second voltage signal V2 are generated and provided to the determination circuit 130 for identify the connection status. If it is detected that the display device is not connected to the connecting port 300 via the transmission cable 400, some portion of the output circuit 100 can be turned off (e.g. the signal processing circuit 140). Even, some of the front-stage circuits in the video processing system (e.g. demodulation circuit, decoding circuit or video adjustment circuit) can be turned off or enter the power saving to reduce the power consumption because it is unnecessary to output the video signals.

In conclusion, the concept of the present invention is to sample the voltage at the output terminal of the output circuit twice, and calculate the difference between the sampled results, to eliminate the offset caused by the coupling capacitor. If the coupling capacitor exists and it leads to the offset in the output voltage, multiple sampled results of the output voltages must have the same offset. Subtracting one sampled result from another sampled result can obtain the difference (V1−V2) that not only reflect the connection status of the load but also excludes the offset. Accordingly, the determination circuit/comparator will not be affected by the offset and can therefore successfully identify the connection status of the load.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output circuit for generating an output to an output terminal that is coupled to a connecting port, comprising:
    a level adjustment circuit, coupled to the output terminal, for generating at least one adjusted signal according to a first voltage signal at the output terminal in a first period and a second voltage signal at the output terminal in a second period; and
    a determination circuit, coupled to the level adjustment circuit, for generating a determination signal according to the at least one adjusted signal, wherein the determination signal indicates whether a load is connected to the connecting port.

2. The output circuit of claim 1, further comprising:
a signal processing circuit, coupled to the determination circuit, wherein the signal processing circuit enters a low-power state when the determination signal indicates the load is not connected to the connecting port.

3. The output circuit of claim 2, wherein the signal processing circuit comprises a current output digital-to-analog converter (DAC), and in the first period and the second period, the signal processing circuit is controlled by the current output DAC to generate a first output current and a second output current to the output terminal respectively according to a first digital signal and a second digital signal, such that the first voltage signal is generated at the output terminal in the first period and the second voltage signal is generated at the output terminal in the second period.

4. The output circuit of claim 2, wherein the signal processing circuit comprises a voltage output DAC, and a current source which coupled to the output terminal, and wherein, in the first period and the second period, the current source provides a first reference current and a second reference current to the output terminal respectively, such that the first voltage signal is generated at the output terminal in the first period and the second voltage signal is generated at the output terminal in the second period.

5. The output circuit of claim 1, wherein the level adjustment circuit comprises:
a sample and hold circuit, coupled to the output terminal, for sampling and holding the first voltage signal in the first period, and generating the adjusted signal according to the second voltage signal and the held first voltage signal in the second period.

6. The output circuit of claim 5, wherein the determination circuit comprises:
a comparator, coupled to the sample and hold circuit, having a first input terminal coupled to a reference signal and a second input terminal coupled to the sample and hold circuit, for receiving the adjusted signal from the second input terminal and comparing the reference signal with the adjusted signal to generate the determination signal in the second period.

7. The output circuit of claim 6, wherein the sample and hold circuit comprises a sampling capacitor and a plurality of controllable switches, and wherein, within the first period, the controllable switches allow the sampling capacitor to be coupled between the output terminal and ground to sample the first voltage signal and then allow the sampling capacitor to be coupled between the second input terminal of the comparator and the output terminal to hold the first voltage signal; and within the second period, the controllable switches allow the sampling capacitor to be coupled between the output terminal and the second input terminal and the sample and hold circuit generates the adjusted signal for the comparator based on the first voltage signal and the second voltage signal.

8. The output circuit of claim 1, wherein the level adjustment circuit comprises:
a sample and hold circuit, coupled the output terminal, and configured to sample the first voltage signal and a first reference signal within the first period, sample the second voltage signal and a second reference signal within the second period, and generate a first adjusted signal and a second adjusted signal according to the sampled first voltage signal, the sampled second voltage signal, the sampled first reference signal and the sampled second reference signal.

9. The output circuit of claim 8, wherein the determination circuit comprises:
a comparator, coupled to the sample and hold circuit, having a first input terminal that receives the first adjusted signal and a second input terminal that receives the second adjusted signal, and configured to compare the first adjusted signal with the second adjusted signal to generate the determination signal within the third period.

10. The output circuit of claim 9, wherein the sample and hold circuit comprises a plurality of sampling capacitors and a plurality of controllable switches, and within the first period, the controllable switches:
allowing a first sampling capacitor of the sampling capacitors to be coupled between the output terminal and a first input terminal of the comparator; and
allowing a second sampling capacitor of the sampling capacitors to be coupled between the first reference signal and the first input terminal;
and within the second period, the controllable switches:
allowing a third sampling capacitor of the sampling capacitors to be coupled between the output terminal and a second input terminal of the comparator; and
allowing a fourth sampling capacitor of the sampling capacitors to be coupled between the second input terminal of the comparator and the second reference signal.

11. The output circuit of claim 10, wherein within the third period, the controllable switches:
allowing the first sampling capacitor to be coupled between a common mode voltage signal and the first input terminal of the comparator;
allowing the second sampling capacitor to be coupled between the common mode voltage signal and the first input terminal of the comparator;
allowing the third sampling capacitor to be coupled between the common mode voltage signal and the second input terminal of the comparator; and
allowing the fourth sampling capacitor to be coupled between the common mode voltage signal and the second input terminal of the comparator.

12. The output circuit of claim 9, wherein the comparator substantially compares a difference between the first reference signal and the second reference signal, with a difference between the first voltage signal and the second voltage signal.

* * * * *